United States Patent
Okuno et al.

[11] Patent Number: 5,154,338
[45] Date of Patent: Oct. 13, 1992

[54] SOLDER REFLOW FURNACE

[75] Inventors: Tetsuya Okuno, Souka; Takashi Nauchi, Tokyo, both of Japan

[73] Assignee: Senju Metal Industry Co., Ltd., Tokyo, Japan

[21] Appl. No.: 710,484

[22] Filed: Jun. 5, 1991

[30] Foreign Application Priority Data

Jun. 6, 1990 [JP] Japan .................................. 2-146288
Jul. 23, 1990 [JP] Japan .................................. 2-194385

[51] Int. Cl.[5] ............................................ B23K 1/012
[52] U.S. Cl. ...................................... 228/42; 228/43; 219/388; 219/478
[58] Field of Search ............................. 228/42, 43, 47; 219/388, 478

[56] References Cited

U.S. PATENT DOCUMENTS

| 5,039,841 | 8/1991 | Kato et al. | 219/388 |
| 5,066,850 | 11/1991 | Kondo | 219/388 |
| 5,069,380 | 12/1991 | Deambrosio | 228/42 |

FOREIGN PATENT DOCUMENTS

| 325451 | 7/1989 | European Pat. Off. |
| 63-177960 | 7/1988 | Japan |
| 63-180368 | 7/1988 | Japan |
| 63-278668 | 11/1988 | Japan |
| 1-177076 | 2/1989 | Japan |
| 64-83395 | 3/1989 | Japan |
| 1-23666 | 7/1989 | Japan |
| 1-186270 | 7/1989 | Japan |
| 61-38985 | 9/1989 | Japan |
| 1-278965 | 11/1989 | Japan |

Primary Examiner—Samuel M. Heinrich
Attorney, Agent, or Firm—Sughrue, Mion, Zinn, Macpeak & Seas

[57] ABSTRACT

A reflow furnace has a tunnel through which a conveyor for printed circuit boards passes. A plurality of pairs of panel-type blowers capable of blowing hot gas are disposed in the tunnel. The two panel-type blowers in each pair are disposed opposite one another above and below the conveyor. Each panel-type blower has an inlet and a discharge port. The discharge ports of opposing panel-type blowers partially overlap one another in the longitudinal direction of the furnace. When a printed circuit board is present between a pair of panel-type blowers, gas discharged from the discharge ports simultaneously heats both sides of the printed circuit board.

10 Claims, 2 Drawing Sheets

SOLDER REFLOW FURNACE

BACKGROUND OF THE INVENTION

This invention relates to a solder reflow furnace for use in the soldering of electronic components to printed circuit boards with a solder paste. It also relates to a panel-type blower for use in such a reflow furnace.

When soldering of electronic components to a printed circuit board is carried out by heating the printed circuit board in a solder reflow furnace, it is necessary to heat all portions of the printed circuit board, including its side edges, corners and central portions at a uniform heating rate so that a uniform temperature profile is obtained. It is desirable that all the portions of the printed circuit board have substantially the same temperature profile and that all the solder paste, which is applied to the printed circuit board prior to heating, reflow simultaneously without there being portions where soldering does not take place or where overheating occurs.

Conventional solder reflow furnaces commonly use infrared heaters to heat printed circuit boards. However, when the packing density of printed circuit boards is very high, it is impossible to heat the printed circuit boards uniformly using only infrared panel heaters. This is because the radiation emitted from the infrared panel heaters travels in straight lines and can not reach components which lie in the shadow of other components. As a result, cold areas occur on the printed circuit board where the temperature is not high enough for soldering to take place. On the other hand, tall electronic components come so close to infrared panel heaters that the top portions of the components are sometimes overheated, resulting in thermal damage.

Another conventional type of reflow furnace, referred to as a hot gas reflow furnace, uses a heated gas to heat printed circuit boards to a soldering temperature. Hot gas reflow furnaces do not have the problems of reflow furnaces using infrared heaters and therefore have come to be widely used.

Hot gas reflow furnaces are classified as either the downward blowing type or the upward and downward blowing type.

In the downward blowing type, a blower for hot gas is installed in the upper portion of a tunnel of a furnace above a conveyor for transporting printed circuit boards through the tunnel. See Japanese Patent Publication No. 38985/1986, Japanese Patent Application Laid-Open Specification No. 177960/1988, Japanese Utility-Model Publication No. 23666/1989, Japanese Utility-Model Application Laid-Open Specification No. 177076/1989, and so on.

In the upward and downward blowing type, blowers for hot gas are installed in a tunnel both above and below a conveyor.

Reflow furnaces of the downward blowing type are very effective for uniformly heating a one-sided printed circuit board (one having electronic components mounted on only one of its sides), since hot gas is blown against only the upper surface of the printed circuit board. However, downward blowing furnaces are less suitable for heating a two-sided printed circuit board (one having electronic components mounted on both of its sides), since hot gas from the blower does not reach the bottom surface of the printed circuit board. As a result, the bottom surface is heated less than the top surface, and the temperature profile of the bottom surface is different from that of the top surface.

Reflow furnaces of the upward and downward blowing type can simultaneously blow hot gas onto both sides of a printed circuit board. Since such furnaces are suitable for heating two-sided printed circuit boards, they are widely used.

Reflow furnaces of the upward and downward blowing type can be further divided into the following two types.

(1) The first type comprises furnaces in which an upper blower and a lower blower are disposed opposite one another such that the gas discharge port of each blower opposes the gas discharge port of the opposing blower and such that the gas inlet of each blower opposes the gas inlet of the opposing blower. See Japanese Patent Application Laid-Open Specification No. 180368/1985, Japanese Patent Application Laid-Open Specification No. 186270/1989, Japanese Patent Application Laid-Open specification No. 278965/1989, and so on. Furnaces of this type are referred to as "opposing flow furnaces".

(2) Furnaces in which an upper blower and a lower blower are disposed opposite one another such that the gas discharge port of each blower opposes the gas inlet of the opposing blower. See Japanese Patent Application Laid-Open Specification No. 83395/1989, for example. Furnaces of this type are referred to as "circular flow furnaces".

In an opposing flow furnace, hot gases blown from the upper and lower blowers run into each other midway between the two blowers. Thus, when a printed circuit board passes between the upper and lower blowers, the top and bottom surfaces of the printed circuit board are equally heated by the hot gases blown from the blowers. However, when no printed circuit board is present between the blowers, hot gases from the upper and lower blowers are locally mixed in a very limited area, resulting in an unstable temperature distribution within the furnace.

In reflow furnaces of the hot gas blowing type, it is generally desirable that hot gases at the same temperature strike against both sides of a printed circuit board. Since the temperature distribution in the longitudinal direction in an opposing flow furnace is unstable in the absence of a printed circuit board, it is impossible to perform uniform heating when a printed circuit board is introduced into the area between opposing blowers.

In a circular flow furnace, hot gases from both the upper and lower blowers circulate within the furnace to create a uniform temperature distribution within the furnace whether or not a printed circuit board is present in the furnace. However, when a printed circuit board passes between the upper and lower blowers, the flow of gas between the blowers is interrupted by the printed circuit board, and only one side of the printed circuit board is heated at a time. As a result, the printed circuit board can not be uniformly heated. The nonuniformity of heating is particularly great when the gas discharge port of one blower is positioned remote from that of the opposing blower in the longitudinal direction of the furnace. This is because the two sides of a printed circuit board passing through such a furnace are heated at different times rather than simultaneously. Thus, within the furnace, there are heating zones where only the top surface of a printed circuit board is heated and other zones where only the bottom surface is heated.

Thus, in conventional circular flow furnaces it is necessary to install blowers such that the discharge ports for hot gas are close to each other and such that numerous circulating paths are established in a limited area within the furnace. This requires that the height of the furnace be as great as possible, resulting in a substantial loss of heat.

SUMMARY OF THE INVENTION

It is an object of the present invention to provide a reflow furnace which can quickly, efficiently, and uniformly heat printed circuit boards.

It is another object of the present invention to provide a reflow furnace which can simultaneously heat both sides of a printed circuit board while maintaining a uniform temperature distribution within the furnace.

It is still another object of the present invention to provide a reflow furnace which is compact.

It is yet another object of the present invention to provide a panel-type blower for use in such a reflow furnace.

A reflow furnace according to the present invention is equipped with a tunnel and a conveyor for transporting printed circuit boards through the tunnel. At least one pair of panel-type blowers is disposed in the tunnel, each pair comprising an upper panel-type blower and a lower panel-type blower disposed opposite one another above and below the conveyor. Each of the panel-type blowers has a discharge port from which hot gas is discharged and an inlet through which gas is drawn into the blower. The discharge port of each panel-type blower opposes the inlet of the opposing panel-type blower and partially overlaps the discharge port of the opposing panel-type blower in the longitudinal direction of the furnace.

Due to the overlap of the discharge ports of the upper and lower panel-type blowers, when a printed circuit board is present in the furnace between the upper and lower panel-type blowers, hot gases discharged from the discharge ports can simultaneously heat both sides of the printed circuit board, resulting in uniform heating of the printed circuit board. Furthermore, since the discharge ports only partially overlap one another, when a printed circuit board is not present in the furnace, a circulating flow is established between the inlets and discharge ports of the panel-type blowers, resulting in a uniform temperature distribution within the furnace.

A panel-type blower according to the present invention has a housing with a gas inlet and a gas discharge port. A porous plate member is disposed in the gas discharge port, and a heating element is disposed in the housing in the vicinity of the porous plate member, which may be a porous metal plate. The housing is connected to a duct having an inlet adjoining the gas discharge port of the housing. A fan is disposed in the duct for drawing air through the inlet of the duct and passing it through the housing. The duct inlet preferably lies in substantially the same plane as the gas discharge port of the housing. A ceramic layer may be formed on the porous plate member, preferably on the porous metal plate for emitting far infrared rays when the porous plate member is heated by the heating element.

DESCRIPTION OF THE PREFERRED EMBODIMENTS

Figure 1:
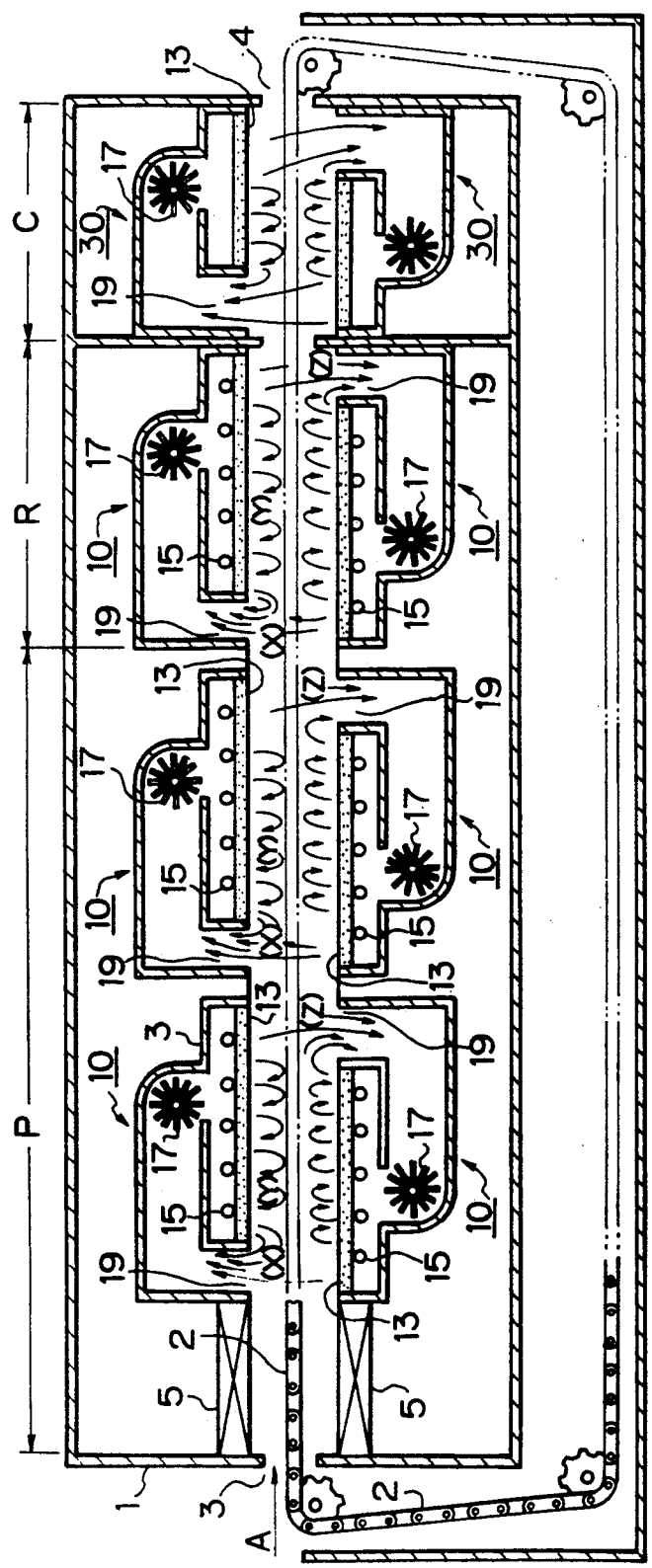
FIG. 1 is a schematic longitudinal cross-sectional view of an embodiment of a reflow furnace according to the present invention.

FIG. 1 is a longitudinal cross-sectional view of an embodiment of a reflow furnace according to the present invention. The furnace includes a tunnel 1 through which unillustrated printed circuit boards are transported in the direction of arrow A by a circulating conveyor 2 such as a chain conveyor. The tunnel 1 has an entrance 3 at one end and an exit 4 at the opposite end. The tunnel 1 is divided into a preheating zone P, a main heating zone R, and a cooling zone C. The preheating zone P is equipped with a pair of panel-type infrared heaters 5 disposed above and below the conveyor 2 and two pairs of panel-type blowers 10 for blowing hot gas at a printed circuit board being transported by the conveyor 2. The infrared heaters 5 can be conventional panel heaters and need not be capable of blowing hot gas. The main heating zone R is equipped with a single pair of panel-type blowers 10 similar in structure to the panel-type blowers 10 of the preheating zone and also capable of blowing hot gas. Each pair of panel-type blowers 10 comprises an upper panel-type blower and a lower panel-type blower 10 respectively installed above and below the conveyor 2. Each of the panel-type blowers 10 has a gas inlet 19 and a gas discharge port 13. The gas inlet 19 of each panel-type blower 10 opposes a portion of the gas discharge port 13 of the opposing panel-type blower, and the gas discharge ports 13 of the upper and lower panel-type blowers 10 of each pair partially overlap one another in the longitudinal direction of the furnace, i.e., in the direction of arrow A. The overlap of opposing discharge ports 13 creates an upward blowing region X, a hot gas impact region Y, and a downward blowing region Z between the upper and lower panel-type blowers 10. In the illustrated example, each of the gas inlets 19 lies just next to and in substantially the same plane as the gas discharge port 13 of the same panel-type blower. Further preferably, the area of the gas discharge 13 may be larger than twice the area of the gas inlet 19. This arrangement can make the blower flat, and can greatly reduce the complexity of the ducting for passing gas from the inlets 19 to the discharge ports 13. Gas is drawn through the gas inlet 19 by a fan 17 or other means for blowing gas, and the gas is heated by a heating element 15 such as an electric heater installed downstream of the fan 17, after which the heated gas is discharged from the gas discharge port 13. The gas discharge port 13 is covered with a porous plate through which the gas can easily pass.

The number of pairs of panel-type blowers 10 in the preheating zone P and the main heating zone R is not critical, and it is possible to have a single pair of panel-type blowers 10 in each zone. However, an arrangement in which the preheating zone P contains a plurality of pairs of panel-type blowers 10 according to the present invention has the advantage that the pair of panel-type blowers 10 closest to the entrance 3 to the tunnel 1 (the leftmost pair in FIG. 1) acts as an air curtain to prevent outside air from entering the tunnel 1 through the entrance 3. Generally, an atmosphere of an inert gas such as nitrogen and argon is maintained inside the tunnel 1. In some cases, it is possible to use heated air instead of an inert gas, in which case it is not necessary to prevent outside air from entering the tunnel 1, or to prevent inside air from escaping to the outside of the tunnel 1. However, the leftmost pair of panel-type blowers 10 also serves to prevent fumes generated within the tunnel 1 from escaping to the outside of the tunnel 1, so a plurality of pairs of panel-type blowers 10 in the preheating zone P can be advantageous even when air is used to heat the printed circuit boards.

The amount of overlap of the discharge ports 13 of each pair of panel-type blowers 10 as measured in the longitudinal direction of the furnace is not critical. If the amount of overlap is 100%, the arrangement becomes similar to that of a conventional opposing flow furnace. If the amount of overlap is 0%, then the arrangement becomes similar to that of a conventional circular flow. Therefore, in the present invention, the amount of overlap is set to be greater than 0% and less than 100% so as to obtain the advantages of both an opposing flow furnace and a circular flow furnace. Preferably, the amount of overlap is from approximately 25% to approximately 75%, and more preferably from approximately 50% to approximately 75%. The overlap is calculated as the length of the portion of a discharge port 13 which overlaps the discharge port 13 of the opposing panel-type blower 10 divided by the total length of the discharge port 13.

In the upward blowing zones X, when no printed circuit boards are present, hot gas which is discharged from the discharge ports 13 of the lower panel-type blowers 10 flow upwards into the gas inlets 19 of the opposing upper panel-type blowers 10, and when printed circuit boards are present, hot gas from the discharge ports 13 strikes the bottom surfaces of the printed circuit boards. In the impact zones Y, when no printed circuit boards are present, hot gases discharged from the discharge ports 13 of opposing panel-type blowers 10 strike against one another, and when printed circuit boards are present, hot gas from the discharge ports 13 simultaneously strikes both the top and bottom surfaces of the printed circuit boards. In the downward blowing zones Z, when no printed circuit boards are present, hot gas discharged from the discharge ports 13 of the upper panel-type blowers 10 flows into the gas inlets 19 of the opposing lower panel-type blowers 10, and when printed circuit boards are present, hot gas from the discharge ports 13 strikes the top surfaces of the printed circuit boards.

The larger the amount of overlap, the larger is the hot gas impact region Y. When the amount of overlap is very small, the impact region Y exists substantially only when a printed circuit board is present between the upper and lower panel-type blowers 10. In such a case, therefore, when a printed circuit board is absent, substantially all portions of the hot gas discharged from a discharge port 13 flows directly into the inlet of the opposing panel-type blower 10 with only minimal contact with the hot gas discharged form the opposing panel-type blower 10. Though there is little impact between the gas discharged from the upper and lower panel-type blowers 10, the temperature distribution between the upper and lower panel-type blowers 10 can be maintained extremely uniform, since substantially all the heating zone is heated by either the hot gas discharged from the upper or lower panel-type blowers. In contrast, when there is a large amount of overlap, the impact region Y exists even in the absence of a printed circuit board between the upper and lower panel-type blowers 10. In this case, turbulence which occurs in the impact region increases the uniformity of the temperature within the furnace, but since the impact region is large, the printed circuit board can be heated more rapidly. Thus, the larger the amount of overlap, the better.

The cooling zone C includes an upper cooling mechanism 30 and a lower cooling mechanism 30 disposed above and below, respectively, the conveyor 2. In the present embodiment, the cooling mechanisms have basically the same structure as the panel-type blowers 10 except that they are not equipped with heating elements. Each of the cooling mechanisms includes a discharge port 13 covered with a porous plate, an inlet 19, and a fan 17 disposed between the inlet 19 and the discharge port 13. Unheated gas circulates between the cooling mechanisms in the manner shown by the arrows and prevents outside air from entering the furnace. The number of cooling mechanisms 30 is not critical, and there need not be any even number of the cooling mechanisms.

In the embodiment of FIG. 1, infrared heaters, preferably far infrared heaters 5 are disposed only at the entrance of the preheating zone P. However, it is possible to install additional infrared heaters or far infrared heaters 5 between the panel-type blowers 10 of the preheating zone P or the main heating zone R in order to prevent a decrease in temperature as a printed circuit board passes through regions where there is no flow of hot gas from the panel-type blowers 10.

Any type of panel-type blower which is capable of blowing hot gas onto a printed circuit board can be employed in the present invention, as long as the discharge ports 13 of opposing panel-type blowers 10 overlap in the longitudinal direction of the furnace. Preferably, however, the panel-type blowers 10 simultaneously generate both hot gas and far infrared rays. Far infrared rays are advantageous because they can perform heating more rapidly than can hot gas, while hot gas has the advantage that it can reach components which lie in the shadow of other components.

Figure 2:
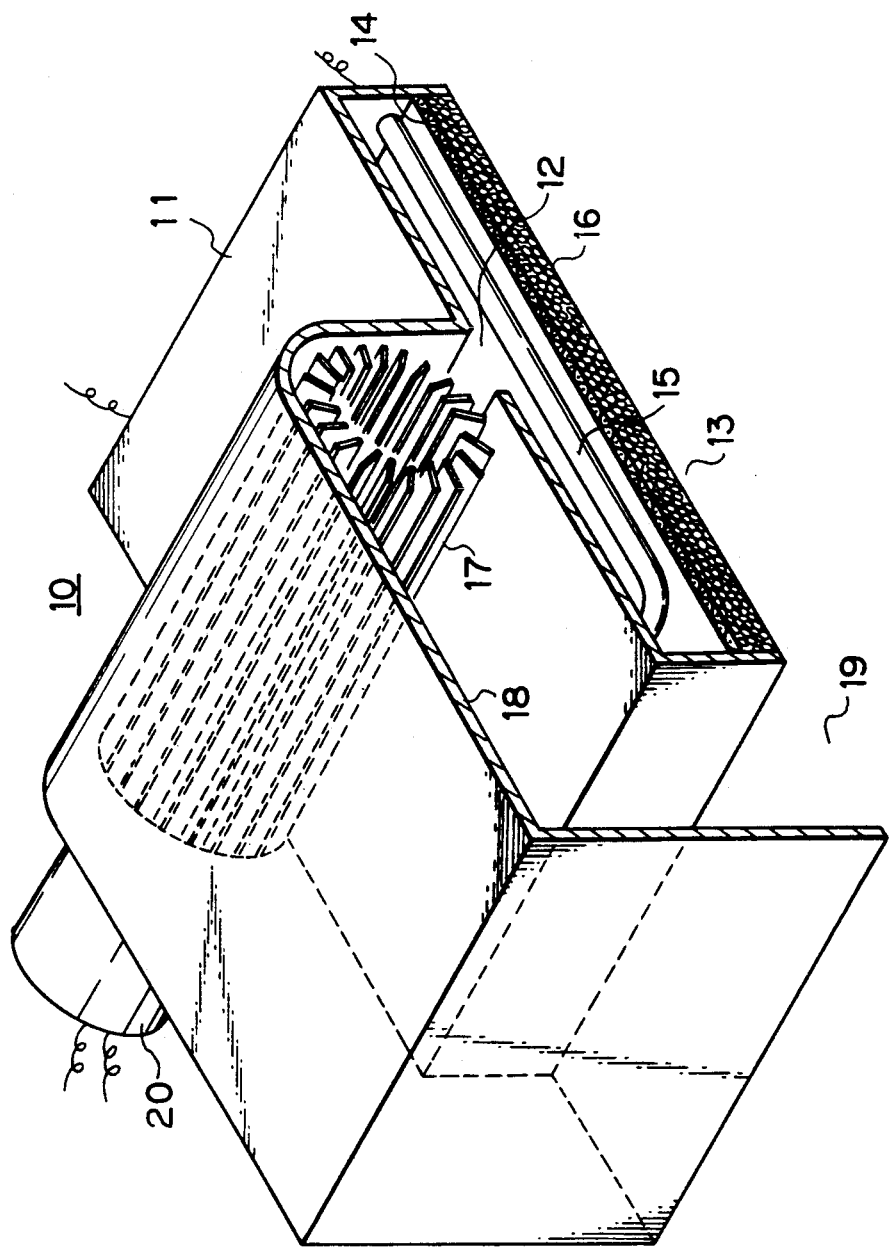
FIG. 2 is a cut-away perspective view of one of the panel-type blowers of the embodiment of FIG. 1.

FIG. 2 is a cut-away perspective view showing one of the panel-type blowers 10 of the embodiment of FIG. 1 in greater detail. The panel-type blower 10 includes a box-shaped housing 11 having a gas inlet 12 formed in its upper surface and an open bottom that serves as a discharge port 13. The gas inlet 12 extends across the entire width of the housing 11. A porous metallic plate 14 through which air can easily pass is installed in the discharge port 13, and a porous ceramic layer 16 through which gas can easily pass is formed on the surface of the porous plate 14. Examples of a suitable material for the porous plate 14 are a three-dimensional metallic mesh made by electroforming such as that sold by Sumitomo Electric Industries, Ltd. under the trade name of "Celmet", or a porous sintered metal plate obtained by sintering of metal powder.

The porous ceramic layer 16 can be formed on the porous plate 14 by any suitable method, but preferably it is formed by flame spraying, since flame spraying can form a strong bond between the porous plate and the ceramic layer 16 without clogging the pores of the porous plate 14. The ceramic layer 16 can be made of any material capable of generating far infrared rays when heated. Some examples of suitable ceramics are oxides of Si, Ti, Zr, Al, and the like. An electric heating element 15 is disposed in the vicinity of the inner surface of the porous plate 14. The heating element 15 preferably extends along a winding path so as to heat as much of the surface of the porous plate 14 as possible.

The inlet 12 of the housing 11 is connected to one end of a duct 18 for introducing gas into the housing 11. The opposite end of the duct 18 serves as an inlet 19. The inlet 19 of the duct 18 lies in substantially the same plane as the discharge port 13 of the housing 11. A fan 17 is disposed in the duct 18 between the inlet 19 of the duct 18 and the inlet 12 of the housing 11. The fan 17 is rotated in a direction to draw gas into the duct 18 through the inlet 19. Any type of fan 17 or other blowing mechanism can be used, but a cylindrical fan having a plurality of fins extending parallel to the axis of the fan is particularly suitable since an adequate flow of gas can be achieved using a small diameter fan. The fan 17 is driven by a motor 20 installed on the outside of the duct 18.

When current is passed through the electrical heating element 15, the heating element 15 heats up the inside of the housing 11 as well as the porous plate 14, which in turn heats the ceramic layer 16. When heated, the ceramic layer 16 generates far infrared rays. The rotation of the fan 17 by the motor 20 draws gas from the inside of the tunnel 1 through the inlet 19 and forces it through the inlet 12 of the housing 11. The gas passes through the porous plate 14 and in the process is heated by contact with the plate 14 as well as by heat from the heating element 15. The heated gas is then discharged through the porous ceramic layer 16 into the tunnel 1 of the furnace.

The panel-type blower 10 illustrated in FIG. 2 can generate both hot gas and far infrared rays, so it is very effective for heating printing circuit boards having a high packing density.

When solder paste is heated, flux fumes are generated. The flux fumes tend to adhere to the inside of the tunnel, to the fan and discharge port of a panel-type blower, and to the hands and clothing of an operator. Furthermore, flux fumes which accumulate on the inner surfaces of a tunnel may drip from the tunnel onto a printed circuit board passing through the tunnel. The flux which drips onto a printed circuit board not only degrade the appearance of the printed circuit board but can also decrease the electrical resistance of the printed circuit board, sometimes causing a malfunction of electronic devices equipped on it. However, the porous plate 14 and the ceramic layer 16 serve as a catalyst to combust a large amount of the flux fumes passing through them. As a result, the amount of fumes that adhere to the printed circuit board and to the inside of the furnace is greatly reduced. This improves the appearance and the quality of the printed circuit board, and also reduces the odors emitted from the furnace, contributing to a more healthful workplace.

Next, the heating of a printed circuit board using the embodiment of FIG. 1 will be explained.

When a printed circuit board is carried in the direction of arrow A by the conveyor 2, the printed circuit board is first heated by the far infrared heaters disposed near the entrance of the furnace. The printed circuit board is gradually heated by far infrared rays from the far infrared heaters. Since far infrared rays travel along straight lines, those portions of the printed circuit board that are in the shadows of components mounted on the printed circuit board are not heated by the far infrared rays, so the temperature of those portions is lower than that of other portions of the printed circuit board.

When the printed circuit board enters between the first pair of panel-type blowers 10, those portions of the printed circuit board which were not heated by the far infrared heaters are heated by the circulating flow of hot gas between the panel-type blowers 10, so the printed circuit board is uniformly heated.

Namely, as a printed circuit board passes between a pair of panel-type blowers 10, it first enters an upward blowing zone X. Here, the lower surface of the printed circuit board is heated by infrared rays or far infrared rays and hot gas discharged from a lower panel-type blower 10. When the printed circuit board is carried somewhat further in the direction of arrow A in FIG. 1, it enters a hot gas impact zone Y, and the top and bottom surfaces of the printed circuit board are simultaneously heated by far infrared rays and hot gas discharged from upper and lower panel-type blowers 10. When it is carried further in the direction of arrow A, it enters a downward blowing zone Z where only the top surface of the printed circuit board is heated by far infrared rays and hot gas discharged from the upper panel-type blower 10. Thus, as a printed circuit board passes between a pair of panel-type blowers 10, first only the lower surface of the printed circuit board is heated, then both the upper and lower surfaces are heated, then only the upper surface is heated. However, when the amount of overlap is large, i.e., when the discharge port extends long enough, i.e., substantially all the length of each of the blowers in the longitudinal direction and the areas of the gas inlets are limited, the upper and lower surfaces of the printed circuit board is heated substantially simultaneously.

In the embodiment of FIG. 1, the gas discharge port 13 of the lower panel-type blower 10 of each pair is disposed upstream of the gas discharge port 13 of the upper panel-type blower 10. However, the order of the arrangement of the inlet and discharge port of the panel-type blower is not critical, and the inlets 19 and discharge ports 13 of the panel-type blowers 10 can be arranged so that the upper surface of a printed circuit board is heated before its lower surface.

Normally, heating by the panel-type blowers 10 is rapid, and there is the possibility of the printed circuit boards being overheated. However, by properly controlling the speed of the conveyor 2, the length of time for which a printed circuit board remains between the panel-type blowers 10 can be limited to a very short period, thereby preventing excessive heating while still achieving uniform heating of the printed circuit board. A printed circuit board which is preheated in the preheating zone P then enters the main heating zone R. Here, the temperature is suddenly increased, and all the solder paste on the printed circuit board is melted. The temperature of the hot gases discharged from the panel-type blowers 10 can be controlled by adjusting the current flowing through the heating elements.

In the preheating zone P, a printed circuit board is heated to approximately 150° C. In the main heating zone R, the printed circuit board is heated in the same manner as in the preheating zone P but to a higher temperature of approximately 230° C. to melt the solder paste on the printed circuit board.

After passing through the main heating zone R, a printed circuit board is introduced into the cooling zone C wherein the molten solder on the printed circuit board is cooled and solidified by the cooling gas discharged from the cooling mechanisms.

We claim:

1. A reflow furnace for soldering electrical components comprising:
   a tunnel;
   a conveyor for printed circuit boards extending through the tunnel;
   at least one pair of panel-type blowers disposed in the tunnel, each pair comprising an upper panel-type blower and a lower panel-type blower disposed on opposite sides of the conveyor, each of the panel-type blowers having a discharge port and an inlet, the discharge port of each panel-type blower opposing the inlet of the opposing panel-type blower and overlapping the discharge port of the opposing panel-type blower in the longitudinal direction of the tunnel.

2. A reflow furnace as claimed in claim 1 wherein the overlap is approximately 25% to approximately 75%.

3. A reflow furnace as claimed in claim 1 wherein the panel-type blower is that which simultaneously generates both hot gas and far infrared rays.

4. A reflow furnace as claimed in claim 1 wherein the amount of overlap is such that an upward blowing region, a hot gas impact region, and a downward blowing region are provided between the upper and lower panel-type blowers.

5. A reflow furnace as claimed in claim 1 wherein the tunnel is divided into a preheating zone, a main heating zone, and a cooling zone, and at least one pair of the panel-type blowers is provided in each of the preheating zone and main heating zone.

6. A reflow furnace as claimed in claim 1 wherein each of the panel-type blowers comprises:
   a housing having an outlet confronting the conveyor and constituting the discharge port;
   a porous plate member disposed in the outlet;
   a heating element disposed in the vicinity of the porous plate member; and
   a fan for causing a gas to flow through the inlet, through the porous plate member, and through the discharge port.

7. A reflow furnace as claimed in claim 6 wherein each of the panel-type blowers comprises:
   a duct having a first end having an inlet opposing the conveyor and a second end connected to the inlet of the housing, the fan being disposed between the first and second ends.

8. A reflow furnace as claimed in claim 7 wherein the inlet of the duct and the outlet of the housing lie next to one another and in substantially the same plane.

9. A reflow furnace as claimed in claim 6 wherein the area of the discharge port is 2 times or more larger than the area of the inlet.

10. A reflow furnace as claimed in claim 6 wherein the porous plate member is metallic, and a ceramic layer is provided on this porous metallic plate member.

* * * * *